United States Patent [19]

Single

[11] Patent Number: 4,593,208

[45] Date of Patent: Jun. 3, 1986

[54] CMOS VOLTAGE AND CURRENT REFERENCE CIRCUIT

[75] Inventor: Peter S. Single, San Jose, Calif.

[73] Assignee: National Semiconductor Corporation, Santa Clara, Calif.

[21] Appl. No.: 594,055

[22] Filed: Mar. 28, 1984

[51] Int. Cl.[4] .................. H03L 1/02; H03L 5/00; G05F 1/58

[52] U.S. Cl. .................. 307/296 R; 307/310; 323/316

[58] Field of Search .................. 307/297, 296 R, 310; 323/315, 316

[56] References Cited

U.S. PATENT DOCUMENTS

| | | | |
|---|---|---|---|
| 4,263,519 | 4/1981 | Schade, Jr. | 307/297 |
| 4,287,439 | 9/1981 | Leuschner | 307/297 |
| 4,495,425 | 1/1985 | McKenzie | 307/296 R |
| 4,506,208 | 3/1985 | Nagano | 307/297 |

*Primary Examiner*—John Zazworsky
*Attorney, Agent, or Firm*—Gail W. Woodward; Paul J. Winters; Michael J. Pollock

[57] ABSTRACT

A CMOS circuit is disclosed for developing a proportional to absolute temperature output current and a temperature invariant semiconductor bandgap voltage.

5 Claims, 2 Drawing Figures

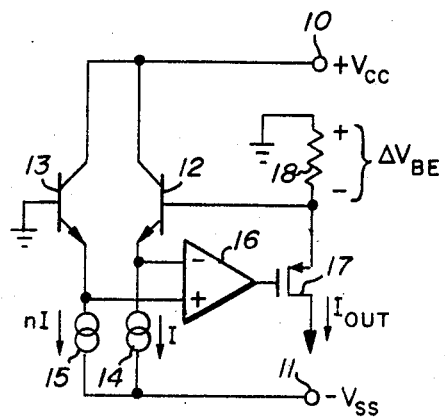
Fig_1
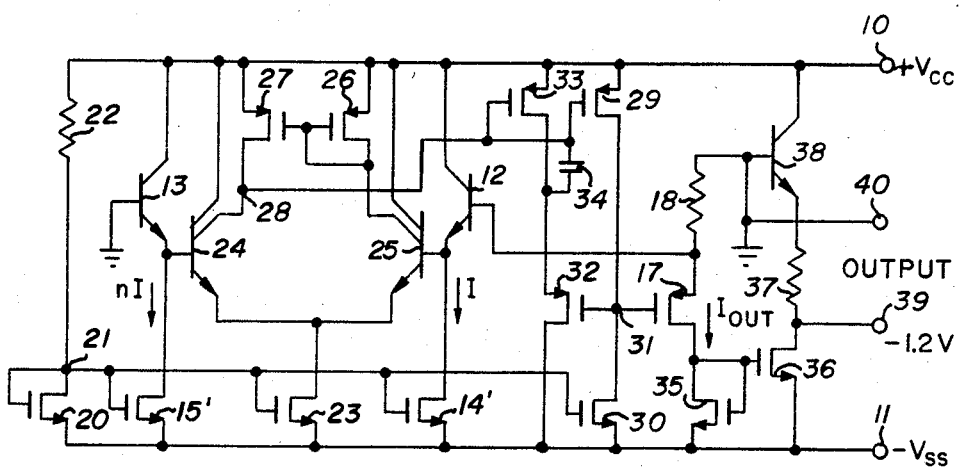
Fig_2

CMOS VOLTAGE AND CURRENT REFERENCE CIRCUIT

BACKGROUND OF THE INVENTION

In complementary metal oxide semiconductor (CMOS) integrated circuits both P-channel and N-channel insulated gate field effect transistor (IGFET) devices are incorporated into a common substrate. It is often desirable to incorporate a voltage or current reference into such circuits. It is well known that IGFETs have a transconductance that has a negative temperature coefficient. This can be offset with a proportional to absolute temperature (PTAT) current supply.

One commonly used voltage reference is the base to emitter voltage ($V_{BE}$) of a bipolar transistor. In CMOS circuits bipolar transistors are commonly regarded as parasitic elements. In the well known P-well form of construction, the P-wells form transistor bases while the N-channel transistor source or drain forms an emitter. The base in this case is commonly reverse biased with respect to the substrate which forms a dedicated collector because it is connected to the most positive applied potential. However, the $V_{BE}$ has a large negative temperature coefficient and its value is a function of processing.

The best known way of obtaining a PTAT voltage is to take the difference in $V_{BE}$ values between two bipolar transistors operating at different current densities. This $\Delta V_{BE}$ is proportional to the natural log of the current density ratio and the absolute temperature. To obtain a PTAT current the $\Delta V_{BE}$ is developed across a fixed value resistor.

When it is desired to obtain a temperature independent voltage it is common practice to add a PTAT voltage to a $V_{BE}$ so that the sum is equal to the semiconductor band gap. For silicon this is about 1.2 volts. For this condition the positive and negative temperature coefficients cancel.

The threshold of a IGFET has been used as a reference voltage but its value can vary substantially as a function of processing. One way around this problem is to take the difference in thresholds between two IGFETs deliberately made to have different thresholds. However, since the difference is highly process sensitive such a reference must be trimmed.

In my copending patent application titled: Low Offset CMOS Comparator Circuit Ser. No. 597,070 filed concurrently herewith on Mar. 28, 1984, a CMOS amplifier circuit is described having a differential input and a single ended output. The circuit uses plural collector NPN transistors in which the bipolar P-well transistors are provided with additional lateral collectors that can be employed in the conventional way. When such transistors are employed in a differential amplifier circuit a high gain comparator having a surprisingly low offset is available without trimming.

SUMMARY OF THE INVENTION

It is an object of the invention to produce a CMOS PTAT current supply source that is not subject to processing variables and does not need to be trimmed.

It is a further object of the invention to produce a temperature stable voltage reference that does not need to be trimmed.

These and other objects are achieved in a CMOS structure as follows. A low offset differential amplifier is created using a pair of bipolar transistors having non-dedicated lateral collectors in addition to the substrate dedicated parasitic collectors associated with the CMOS wells. Two bipolar transistors are operated at different current densities so as to develop a $\Delta V_{BE}$ which is directly coupled to the differential amplifier input. The amplifier is used to express the $\Delta V_{BE}$ across a resistor connected between the two transistor bases to make the output current PTAT. (It is not necessary that the current in the $\Delta V_{BE}$ transistors be fixed).

The current itself can be used or it can be directly coupled to operate other sources or sinks. It can also be mirrored into the emitter of a bipolar transistor through a resistor which therefore develops a PTAT voltage. If the resistor and the current are chosen to develop a voltage that, when added to the transistor $V_{BE}$, is equal to the silicon band gap, a temperature stable voltage source is present.

BRIEF DESCRIPTION OF THE DRAWING

FIG. 1 is a combination schematic-block diagram of a PTAT current source.

FIG. 2 is a schematic diagram of a PTAT current source and a band gap constant voltage reference.

DESCRIPTION OF THE INVENTION

In FIG. 1 the circuit is operated from a power supply connected + to $V_{CC}$ terminal 10 and − to $V_{SS}$ terminal 11. A pair of bipolar transistors 12 and 13 are operated at different current densities. These transistors are conventional CMOS NPN dedicated collector devices. Constant current sink 14 passes I through transistor 12 and constant current sink 15 passes a ratioed current, nI, through transistor 13. The current ratio n is made relatively large as will be shown below. The transistor emitters are coupled to the input terminals of diff-amp 16, the output of which drives the gate of P-channel transistor 17. The base of transistor 13 is grounded and the base of transistor 12 is driven from the source of transistor 17. Resistor 18 is coupled between the bases of transistors 12 and 13 so that $\Delta V_{BE}$ appears thereacross. Diff-amp 16, by way of transistor 17, will drive the base of transistor 12 to that level where the differential voltage between the emitters of transistors 12 and 13 is close to zero. It can be seen that for the current ratio shown, the base of transistor 12 will be below ground by $\Delta V_{BE}$. The output current will be:

$$I_{OUT}=kT/qR \cdot 1_n n = (\Delta V_{BE}/R)(PTAT)$$

where:
 k = Boltzmann's constant
 q = Electron charge
 n = Current density ratio
 R = Value of resistor 18
 T = absolute temperature where n = 10, $\Delta V_{BE}$ at 300° K. will be close to 60 millivolts. This voltage has a temperature coefficient of +0.2 millivolts per degree absolute.

FIG. 2 is a schematic diagram of a temperature independent voltage source. Where the elements correspond to those of FIG. 1 the same numbers are used. Bipolar transistor 12 and 13 are matched and respectively biased at I and nI by constant current sink transistors 14' and 15'. As above n is made about 10 to produce a $\Delta V_{BE}$ of about 60 millivolts across resistor 18 at 300° K.

Transistor 20 sets up N-channel bias node 21, as a current mirror, due to the current flowing in resistor 22. Transistor 15' is made 10 times the size of transistor 14' to provide for ratioed currents in transistors 12 and 13. Transistor 23 provides the tail current for the input stage of diff-amp 16 in the form of bipolar transistors 24 and 25. P-channel transistors 26 and 27 form a load for the non-dedicated collectors of transistors 24 and 25 with a single ended output at node 28 coupled to the gate of P-channel transistor 29. N-channel transistor 30 acts as a constant current load for transistor 29 at node 31. This node drives output transistor 17 and frequency compensation feedback transistor 32. Transistor 33 acts as a driven load for transistor 32. Capacitor 34 acts as a frequency compensation element.

$I_{OUT}$ flowing in transistor 17 (and resistor 18) can be taken as the PTAT current if desired. As shown it flows in transistor 35 which acts as the input element of a current mirror with transistor 36. Thus, assuming that transistors 35 and 36 are matched, $I_{OUT}$ will also flow in resistor 37 and transistor 38. If resistor 37 is made 10 times the value of resistor 18 it will develop a $\Delta V_{BE}$ of about 600 millivolts at 300° K. Thus terminal 39 will be 1.2 volts below ground which is close to the silicon bandgap. As the drop across resistor 37 increases with temperature (PTAT) the $V_{BE}$ of transistor 38 will fall by about the same amount thus providing a temperature stable output voltage.

Alternatively resistors 18 and 37 can be matched and transistor 36 made 10 times the size of transistor 35 to provide a decade of current gain. Thus $10I_{OUT}$ will flow in resistor 37 and the emitter of transistor 38. Clearly both the current mirror and/or the resistors can be ratioed. The only requirement is that the $\Delta V_{BE}$ across resistor 37 be 10 times that across resistor 18.

As pointed out in my above mentioned concurrently filed application Ser. No. 594,070, the input offset for the diff-amp is small compared to $\Delta V_{BE}$. Since all of the critical parts are determined by geometrical considerations, a high degree of accuracy can be obtained without trimming. For example the ratio n is determined by the ratio of transistors 14' and 15'. The ratio of resistors 18 and 37 and/or the sizes of transistors 35 and 36 determines the $\Delta V_{BE}$ in the output circuit.

EXAMPLE

The circuit of FIG. 2 was constructed using P-well CMOS parts. Transistor 12 was matched to transistor 13 and transistor 24 was matched to transistor 25. The following component values were employed

| COMPONENT | VALUE | UNITS |
| --- | --- | --- |
| 14' | 10/20 | microns |
| 15' | 100/20 | microns |
| 17 | 400/6 | microns |
| 18 | 1.5K | ohms |
| 20 | 50/5 | microns |
| 22 | 120K | ohms |
| 23 | 20/5 | microns |
| 26,27,29 | 20/10 | microns |
| 30 | 20/20 | microns |
| 32,33 | 20/6 | microns |
| 34 | 0.5 | picofarads |
| 35 | 70/6 | microns |
| 36 | 70/6 | microns |
| 37 | 15K | ohms |

The values shown for the field effect transistors represent the device W/L values. $V_{CC}$ was +5 volts and $V_{SS}$ was −5 volts. Ten different references were measured. Of these the maximum was 1.261V and the minimum was 1.199V. This represents a variation of only ±2.5% and demonstrates that trimming is not required for high accuracy. A reference was measured and found to vary by approximately 1% over the range from −40° C. to +85° C. The current in resistor 18 was 40 microamperes at 300° K. and was PTAT over the above temperatures.

The invention has been described and a working example detailed. When a person skilled in the art reads the foregoing description, alternatives and equivalents, within the spirit and intent of the invention, will become apparent. For example, while the description relates to P-well CMOS structures, N-well construction is applicable (along with a power supply polarity reversal). Therefore it is intended that the scope of the invention be limited only by the following claims.

I claim:

1. A CMOS current reference capable of conducting an output current having a value proportional to absolute temperature, said circuit comprising:

first and second supply terminals connectable to a source of operating power;

a first bipolar transistor having a collector connected to said first supply terminal, a base connected to a reference potential and an emitter coupled to said second supply terminal by way of a first constant current device;

a second bipolar transistor having a collector connected to said first terminal, a base coupled to said base of said first bipolar transistor through a first resistor, and an emitter coupled to said second supply terminal by way of a second constant current device;

means for ratioing the current densities in said first and second bipolar transistors so that said first bipolar transistor conducts a multiple of the current density of said second bipolar transistor;

a field effect transistor having a source coupled to said base of said second bipolar transistor, a drain coupled to conduct said output current, and a gate; and a differential amplifier having an output coupled to said gate of said field effect transistor, a non-inverting input coupled to said emitter of said first bipolar transistor and an inverting input coupled to said emitter of said second bipolar transistor whereby said differential amplifier drives said base of said second bipolar transistor, by way of said field effect transistor acting as a source follower, to force said emitters of said first and second bipolar transistors to the same potential so that the differential base to emitter voltage ($\Delta V_{BE}$) of said first and second bipolar transistors appears across said first resistor.

2. The circuit of claim 1 wherein said differential amplifier has an input stage comprising a pair of differentially connected plural collector bipolar transistors each one of which includes a dedicated collector connected to the substrate of said CMOS circuit and one of said collectors is in the form of a non-dedicated lateral element capable of providing a stage output.

3. The circuit of claim 1 wherein said first and second bipolar transistors are matched and said means for ratioing is accomplished by ratioing the conduction of said first and second constant current devices.

4. The circuit of claim 1 in further combination with a third bipolar transistor having its collector coupled to said first supply terminal, its base coupled to said reference potential and its emitter coupled to a second resistor connected between a constant voltage output terminal and said third bipolar transistor emitter, and a current mirror having its input coupled to said drain of said field effect transistor and its output coupled to said second resistor, said third bipolar transistor being biased to develop a base to emitter voltage, $V_{BE}$, in response to conducting said output current of said current mirror whereby said $V_{BE}$ and the voltage drop across said second resistor are added together to produce a temperature invariant output voltage equal to the bandgap voltage of the semiconductor employed in the fabrication of said CMOS circuit.

5. The circuit of claim 4 wherein said current mirror has unity current gain so that said output current flows in said second resistor and said second resistor is ratioed with respect to said first resistor to provide a voltage drop that combines with the $V_{BE}$ of said third bipolar transistor to develop said temperature invariant output voltage.

* * * * *